United States Patent
Maekawa

[19]

[11] Patent Number: 6,079,073
[45] Date of Patent: Jun. 27, 2000

[54] WASHING INSTALLATION INCLUDING PLURAL WASHERS

[75] Inventor: Toshiro Maekawa, Kanagawa, Japan

[73] Assignee: Ebara Corporation, Tokyo, Japan

[21] Appl. No.: 09/052,948

[22] Filed: Apr. 1, 1998

[30] Foreign Application Priority Data

Apr. 1, 1997 [JP] Japan .................................. 9-099769

[51] Int. Cl.[7] .................................................. A47L 25/00
[52] U.S. Cl. .................................. 15/77; 15/88.3; 15/102; 15/103.5
[58] Field of Search .............................. 15/77, 88.3, 97.1, 15/102, 103.5, 88.2

[56] References Cited

U.S. PATENT DOCUMENTS

| | | | |
|---|---|---|---|
| 5,475,889 | 12/1995 | Thrasher et al. | 15/88.3 |
| 5,498,294 | 3/1996 | Matsushita et al. | 15/88.1 |
| 5,518,542 | 5/1996 | Matsukawa et al. | 15/77 |
| 5,581,837 | 12/1996 | Uchiyama et al. | 15/88.3 |
| 5,655,954 | 8/1997 | Oishi et al. | 451/67 |
| 5,675,856 | 10/1997 | Itzkowitz | 15/77 |
| 5,701,627 | 12/1997 | Matsumura et al. | 15/88.2 |
| 5,745,945 | 5/1998 | Manfredi et al. | 15/77 |
| 5,860,181 | 1/1999 | Maekawa et al. | 15/77 |
| 5,868,866 | 2/1999 | Maekawa et al. | 134/34 |

FOREIGN PATENT DOCUMENTS

8-238463  9/1996  Japan .

*Primary Examiner*—Theresa T. Snider
*Attorney, Agent, or Firm*—Wenderoth, Lind & Ponack, L.L.P.

[57] ABSTRACT

A roll type washer is a primary washer and includes a roll type washing member which rotates in contact with the surface of a semiconductor wafer, and a rotary driving member which rotates the semiconductor wafer. A secondary washer is a pad type washer including a pad washing mechanism which rotates and pivots over the semiconductor surface while in contact with the surface, and a rotary member which rotates the semiconductor wafer.

11 Claims, 7 Drawing Sheets

WASHING INSTALLATION INCLUDING PLURAL WASHERS

BACKGROUND OF THE INVENTION

The present invention relates to a washing apparatus and washing method for washing semiconductor wafers and the like.

As integration of semiconductor wafers and the like has increased in recent years, circuit wiring has become microsized, and accordingly dust particles present on wafers and the like must be reduced; that is, there is a need for super-cleaning.

Such super-cleaning of semiconductor wafers and the like is difficult to achieve through a single washing step during a washing operation of the semiconductor wafers and the like. Therefore, it has been the practice in a conventional process for washing semiconductor wafers and the like to provide a plurality of washing apparatuses which are used to clean residue dust off the surfaces of the semiconductor wafers and the like by washing them a plurality of times so as to achieve super-cleaning.

Figure 3:
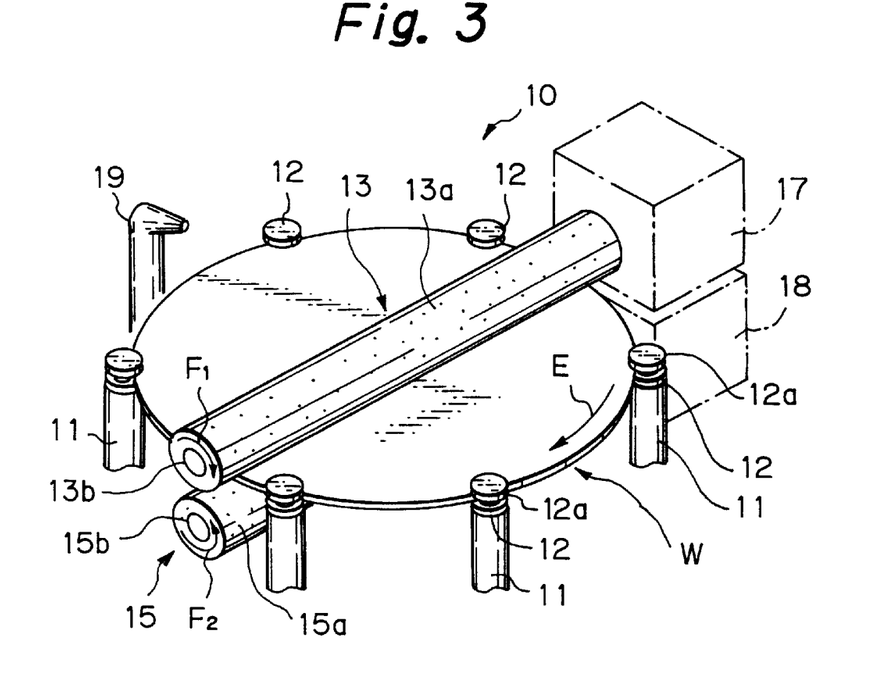
FIG. 3 is a perspective view illustrating a roll type washer to be used in a primary washer 10.

In other words, in the case of washing a semiconductor wafer which has been polished by means of a polishing device, for example, a plurality of roll type washers as shown in FIG. 3 are arranged in a side by side configuration, together with a spin dryer (not shown).

The roll type washer as shown comprises a plurality (six in the drawing) of spindles 11 (a retaining member having a rotary-drive mechanism) which rotate while supporting an outer circumference of disk-shaped semiconductor wafers W, two roll type members 13 and 15 respectively arranged above and below the semiconductor wafer W, driving mechanisms 17 and 18 which actuate roll type members 13 and 15 to move vertically and rotate in the directions of arrows F1 and F2, and a washing liquid dispensing nozzle 19 which may feed a washing liquid (ultra-pure water) onto the surface of semiconductor wafer W. Although omitted in the description to be made hereinbelow, the roll type washer also comprises a nozzle for feeding washing water to the rear surface of the wafer W. Although the roll type members 13 and 15 are formed from PVF (porous polyvinyl formal) sponge-material on their surfaces, it may be alternatively possible to use a foamed polyurethane, a nylon brush or a mohair made of nylon to form the roll type members.

In order to wash the semiconductor wafer W by means of this roll type washer, the outer periphery of the semiconductor wafer W is contained in and brought into contact with circumferential grooves 12a which are defined in tops 12 of spindles 11, and the semiconductor wafer W is caused to rotate in the direction of the arrow E substantially at a constant speed by spinning tops 12 at the same speed. In the meantime, the semiconductor wafer W is positioned such that its surface to be polished is oriented upwardly.

Then, members 13 and 15 are brought into abutment with upper and lower surfaces of the semiconductor wafer in such a manner that the members sandwich the semiconductor wafer therebetween, and simultaneously a washing liquid is injected or caused to fall through washing liquid dispensing nozzle 19.

Thus, dust particles which adhere to the upper and lower surfaces of the semiconductor wafer W are scraped away by means of roll type members 13 and 15, and then flow away together with the washing liquid.

The roll type members 13 and 15 have large surface areas (that is, large contact areas against the semiconductor wafer W). Thus, they provide optimum washing of semiconductor wafers, which have been polished by means of a polishing device and upon which a great deal of dust particles have been deposited, while simultaneously ensuring a long operational life.

The semiconductor wafer W which has been washed is repeatedly washed by means of second and subsequent roll type washers in a similar fashion, and then dried in a spin dryer (not shown). In the meantime, the lower roll type member 15 optionally may be omitted, if so required.

The prior art technique as above-described has suffered from several problems which will be described hereinbelow.

(1) In the roll type washers in the above-described prior art arrangement, the outer peripheral speed of the roll type member is constant at all portions thereof. But, since the peripheral speed of the wafer becomes progressively slower toward the central portion thereof, a relative speed between the roll type member and the semiconductor wafer W becomes progressively slower toward such central portion. Accordingly, the dust removal capability of the member is reduced at the central portion of the wafer W in comparison with the capability occurring at the outer periphery of the wafer. Thus, there is a tendency that dust may be left around the central portion. Also, dust which is not removed by the primary washer may not be removed by second and subsequent washers.

(2) Since the semiconductor wafer W is rotated by rotation of tops 12, and when the tops 12 rotate at a substantial high-speed, the semiconductor wafer W may slip, preventing it from turning at a correspondingly high-speed. Moreover, the circumferential grooves 12a in the tops 12 can become worn to thus generate dust particles. Therefore, the semiconductor wafer W may not be washed efficiently. The wafer is rotated for practical purposes at a speed of about 300 rpm, and should preferably be rotated at the speed of about 100 rpm.

This roll type washer cannot be used as it is without modification in the spin dryer in which the semiconductor wafer must be spun at a speed over 2000 rpm, for example. Thus, when this roll type washer is arranged in plural numbers, another spin dryer must be provided additionally, thereby increasing dimensions of the washing installation itself.

The semiconductor wafer W is arranged to be rotated around its own axis with its outer periphery in contact with the tops 12 since the roll type washing members 13 and 15 are arranged to span the diameter of front surface and reverse surface of the semiconductor wafer W. Thus, the wafer W can be washed while the members are constantly kept in contact not only with opposite surfaces of wafer W, but also with the peripheral portion of the wafer W, without making contact with the tops 12 and the spindles 11.

SUMMARY OF THE INVENTION

The present invention has been made in consideration of the above-described matters, and its object is to provide a washing apparatus and a washing method by which effective washing can be achieved by combining a plural number of washers, and additionally the washing apparatus may be used without modification as a spin dryer.

The present invention includes a washing installation in which a plate-like work piece to be washed is cleaned in washing operations by a plurality of washers. In the washing installation of the present invention, a washer in an early stage among the plurality of washers includes a roll type member which rotates around a rotary axis which is substantially horizontal relative to the work to be washed while in contact with at least one of front and reverse surfaces of the work to be washed, and a retaining member which retains the work. A washer in a later stage is a pad type washer and a rotary member which rotates the work.

The washing installation of the present invention may be such that (a) the roll type washer has means for feeding a washing liquid to the washing surface of work to be washed; (b) the retaining member comprises a drive mechanism for rotating the work to be washed; (c) the portion of the roll member which contacts the work to be washed is formed of sponge; (d) the roll member has a number of projections on its cylindrical outer surface; (e) the pad type member is caused to rotate around an axis which is substantially vertical relative to the surface of the work; (f) the pad type washer has means for feeding a washing liquid to the surface of the work; (g) the portion of the pad type washer that contacts the work is formed of sponge.

Moreover, the present invention resides in a washing method in which a plate-like work to be washed is cleaned through a plurality of washing operations. In the washing method of the present invention, the early stage washing step among the plurality of washing operations is a washing step in which the work is washed by a roll allowing rotation of the roll member while in contact with at least one of front and reverse surfaces of the work.

The washing step in a later stage is a washing step in which the work is washed by allowing the pad type member to contact at least with the front and reverse surfaces of the rotating work to be washed.

The washing method of the present invention may be such that (h) a washing operation in the early stage includes a step in which a washing liquid is fed to the surface of the work to be washed; (i) a washing operation in the later stage includes a step in which the work itself to be washed is caused to rotate around its own axis; (j) the washing step in the later stage includes a step in which the pad type member is caused to rotate around an axis which is substantially vertical relative to the surface to be washed; (k) the washing step in the later stage includes a step in which a washing liquid is fed to the surface to be washed.

PREFERRED EMBODIMENTS OF THE INVENTION

Figure 1:
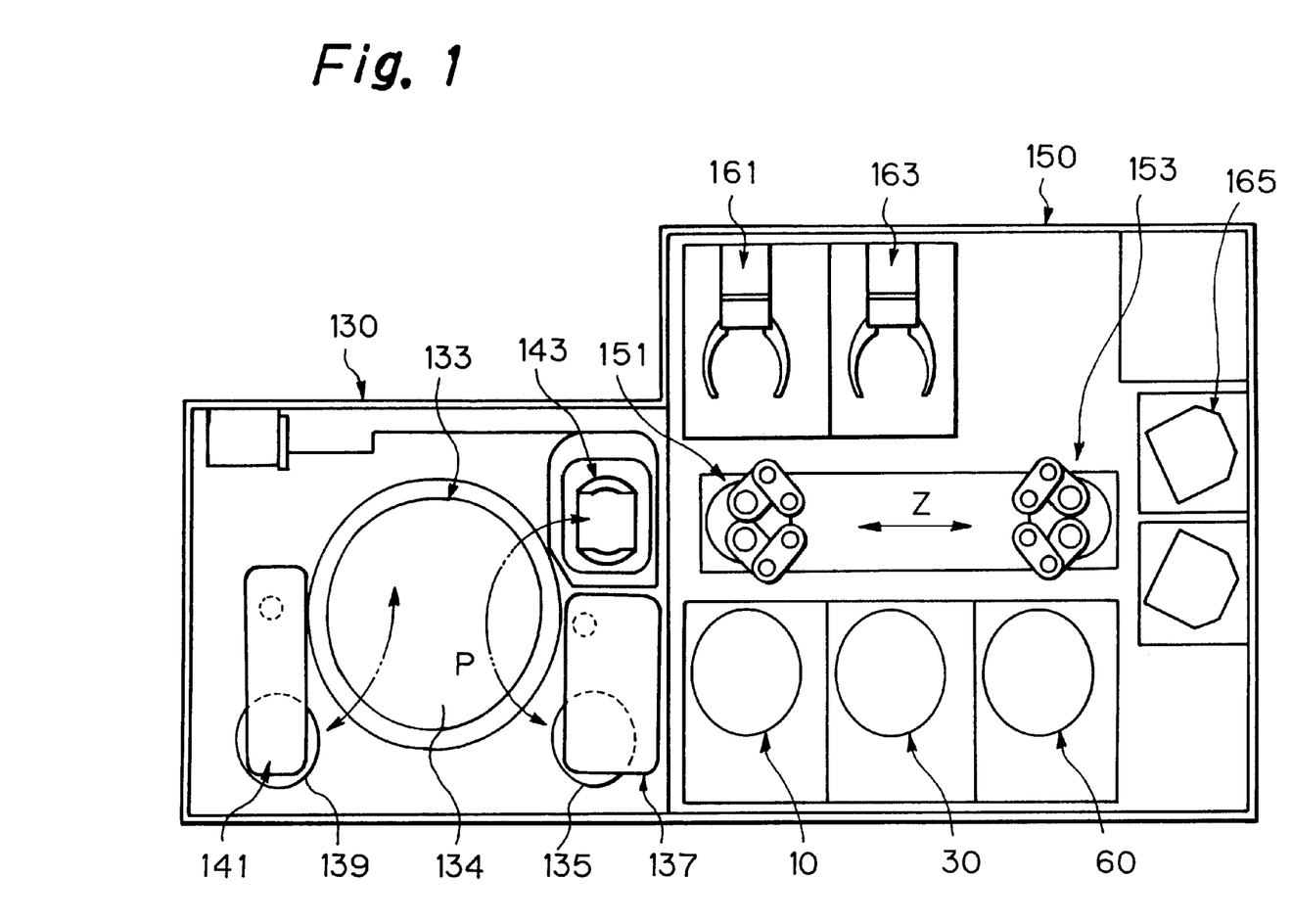
FIG. 1 is a schematic plan view illustrating an interior structure of a polishing device embodying the present invention.

A preferred embodiment of the present, invention will be described in details hereinbelow, with reference to accompanying drawings. FIG. 1 is a schematic plan view illustrating the internal construction of a polishing device that may employ the present invention. As illustrated in FIG. 1, this polishing device consists of a polishing section 130, and a washing section 150.

The polishing section 130 includes a polishing unit 137 having a top-ring 135 and a dressing unit 141 having a dressing tool 139 which are positioned at respective opposite sides of a turntable 133, and a work delivery device 143.

The washing section 150 includes two transfer robots 151 and 153 which are movable in the direction of arrow Z and which are centrally located, a primary washer 10, a secondary washer 30, a spin dryer 60 with a washing capability, and two work turnover or inverting devices 161 and 163. The washers and spin dryer being arranged along on one side of section 150, and the work turnover devices are parallely arranged on the opposite sides thereof.

Figure 2:
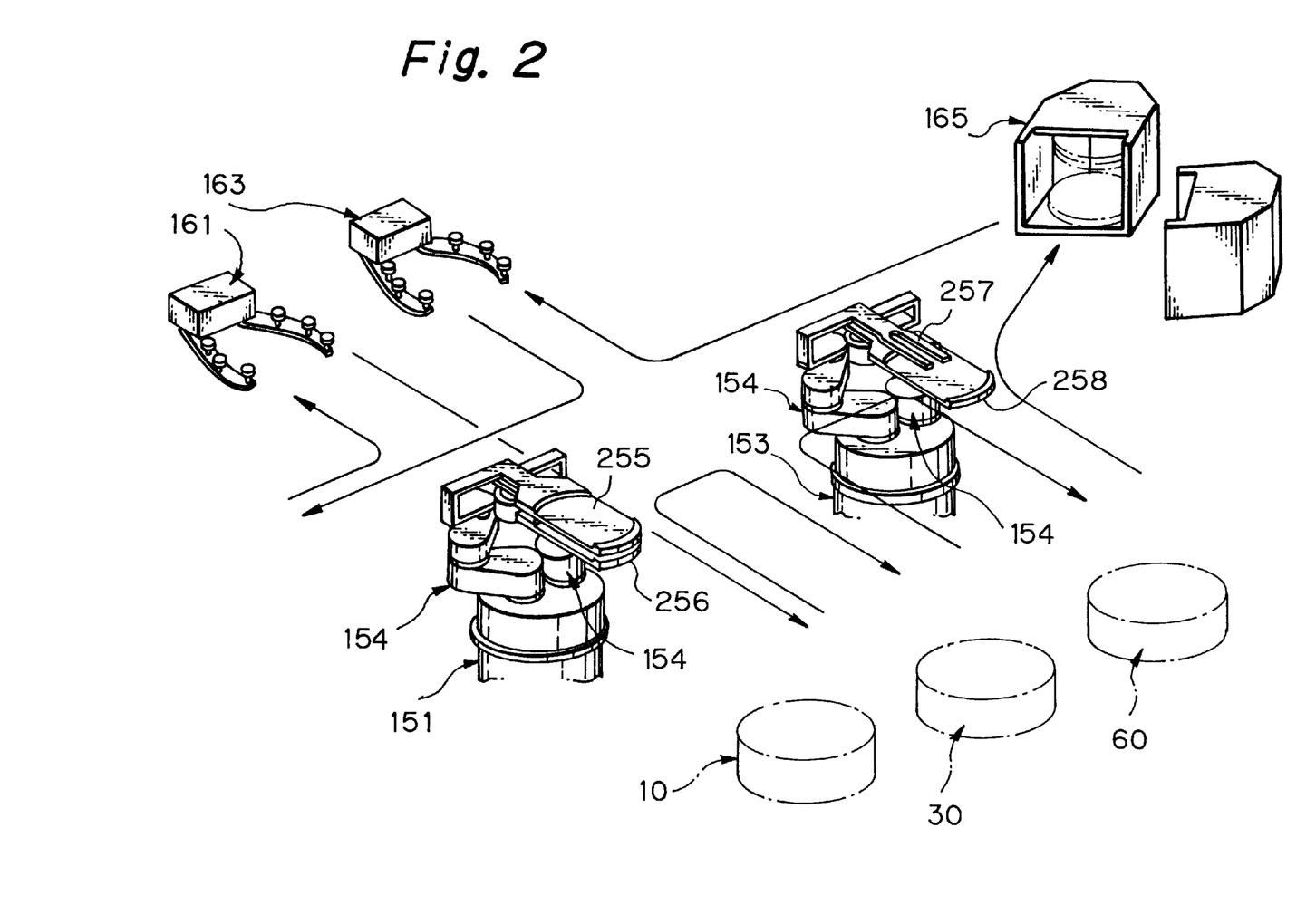
FIG. 2 is a perspective view illustrating the details of the interior of a washing section.

FIG. 2 is a perspective view of essential parts illustrating an interior of the washing section 150. As illustrated in FIG. 2, each of transfer robots 151 and 153 has two sets of arm mechanisms 154 on its respective upper surface. Attached at tip ends of respective arm mechanism 154 are handles 255, 256, 257 and 258 each of which can retain a semiconductor wafer. Handles 255 and 256 and handles 257 and 258 are arranged to be overlapped one upon the other in a vertical direction.

Figure 4:
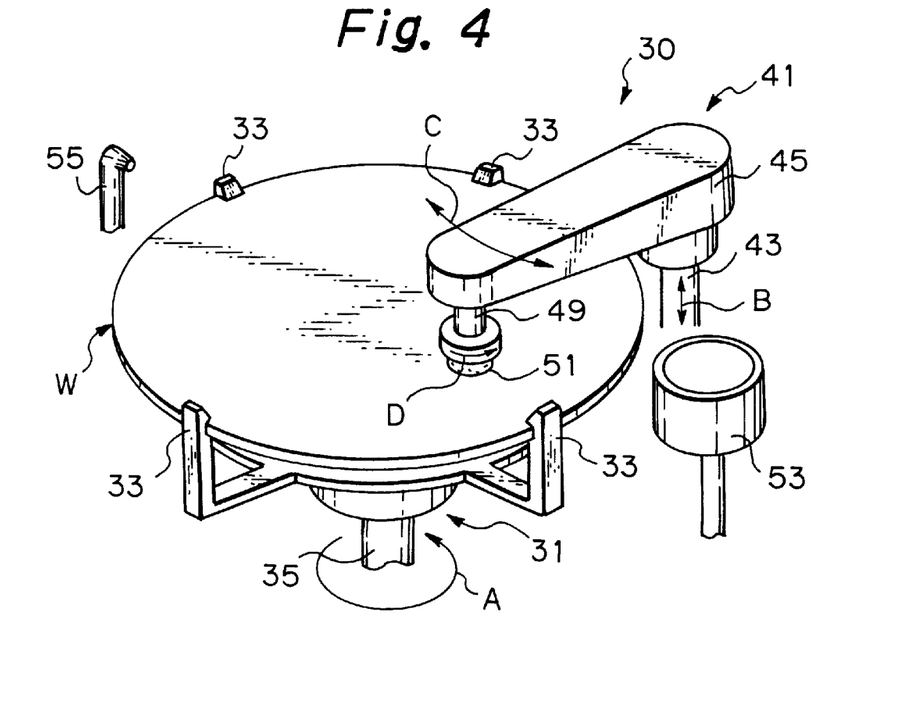
FIG. 4 is a perspective view illustrating a pad type washer to be used in a secondary washer 30.

The primary washer 10 is a roll type washer with the construction as shown in FIG. 3, whereas the secondary washer 30 is a pad type washer with the construction as shown in FIG. 4.

Figure 5:
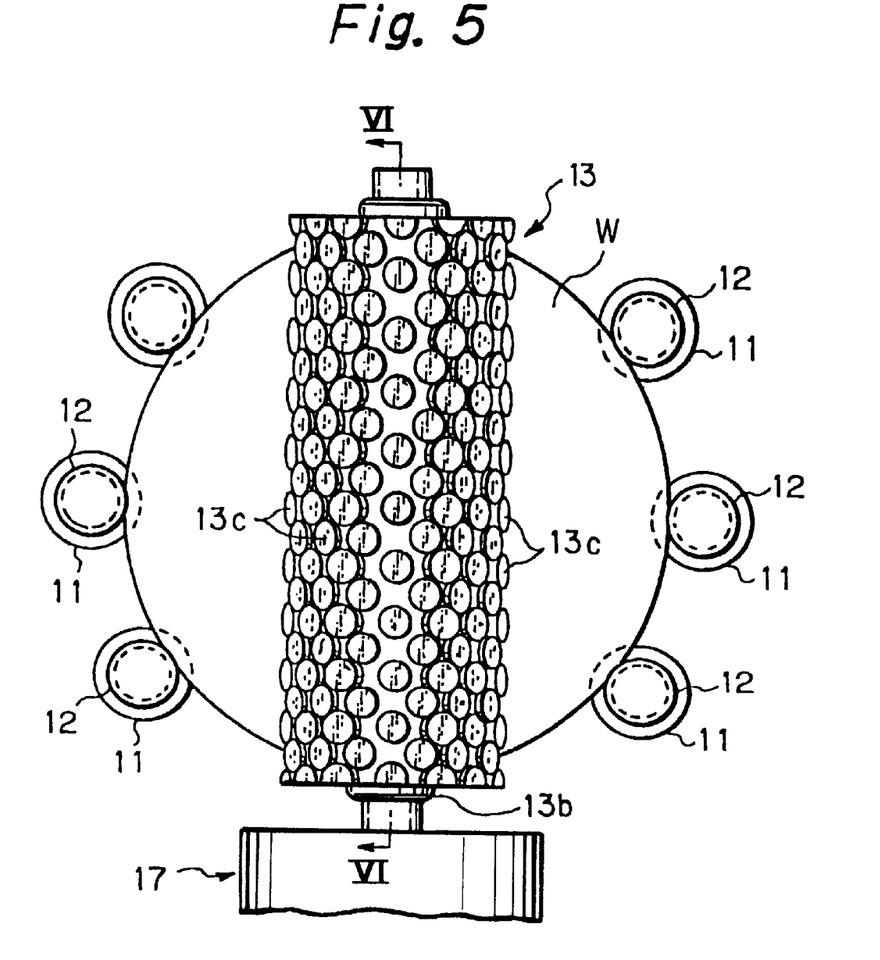
FIG. 5 is a plan view illustrating an upper surface of a roll member as one example of a roll type washer.

The roll type washer 10 as illustrated in FIG. 3 or FIG. 5 comprises a plurality (as illustrated) of spindles 11 (retaining members each having a rotary driving mechanism) which may rotate while retaining the outer periphery of the disk-shaped semiconductor wafer W, and two roll members 13 and 15 each having a roll-shaped configuration and respectively arranged above and below the semiconductor wafer W. Brush driving mechanisms 17 and 18 move rotary shafts 13b and 15b which are parallel with respective surfaces of the wafer W toward and away from the wafer W and rotate the shafts in the directions of arrows F1 and F2. A washing liquid dispensing nozzle 19 feeds a washing liquid (ultra-pure water) to the upper surface of the semiconductor wafer W. A nozzle which is similar to the nozzle 19 is provided to feed a washing liquid to the reverse surface of the wafer.

The members 13 and 15 of the roll type washer 10 are formed by securing cylindrical interior surfaces of cylindrical positions 13a and 15a to shafts 13b and 15b. The positions 13a and 15a can be made using polyvinyl alcohol as a raw material, and can be sponge made from porous polyvinyl formal, (PVF). The average pore size in the sponge preferably is less than 110 μm. The smaller is the pore size, the more effective is the sponge to remove dust. The positions 13a and 15a alternatively may be made of a foamed polyurethane.

Figure 6:
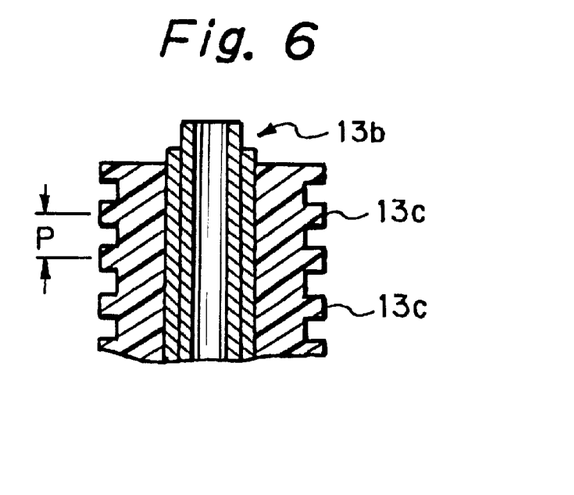
FIG. 6 is a cross-section of the roll type member taken along line Vi-VI in FIG. 5.

The member 13 has disposed on its cylindrical surface a plurality of projections 13c (FIG. 5) spaced longitudinally of the member 13 at a predetermined pitch P (FIG. 6). Rows of the projections 13c are spaced circumferentially at a given pitch around the member 13. Adjacent projections 13c in the circumferential direction of the member 13 are spaced from each other by a distance (P/2) which is half the pitch P in the longitudinal direction of the member 13. Projections 13c are defined such that adjacent ones may be arranged alternatively with a regular interval therebetween. When the member 13 is rotated about its own axis, a first row of the projections 13c disposed longitudinally at the member 13 scrub the surface of semiconductor wafer W. Any surface areas of the semiconductor wafer W which have not been scrubbed by the first row of projections 13c are scrubbed by a second row of the projections 13c adjacent to the first row of the projections 13c. As the semiconductor wafer W is thus scrubbed by successive rows of the projections 13c, its entire surface is scrubbed by the projections 13c. As a result, the semiconductor wafer W is effectively cleaned by the member 13. The member 15 has the same structure as that of the member 13. Each member 13 or 15 may have a different cylindrical surface, e.g. a cylindrical surface without projections, a cylindrical surface with grooves, etc.

As shown in FIG. 4, this pad type washer comprises a rotary chuck mechanism (rotary driving member) 31 and a pad mechanism 41.

The rotary chuck mechanism 31 has on its upper portion chuck claws 33 which may pinch the outer circumference of the disk-shaped semiconductor wafer W, and is constructed such that it may be driven to rotate in the direction of arrow A by means of rotary driving shaft 35. The chuck claws 33 of the rotary chuck mechanism 31 are constituted to be operable so that wafers are charged thereto or discharged therefrom by a robot hand, although such structure is omitted in FIG. 4. The pad mechanism 41 comprises an arm 45 which has freely pivotably supported at one end thereof a shaft 49, a rotary driving shaft 43 which is provided on an opposite end of the arm 45 to project downwardly in the vertical direction toward the surface of the wafer. A pad 51, which is formed of sponge material made from a porous polyvinyl, is mounted to the lower end of rotary driving shaft 49. The pencil type 51 can be made from a foamed polyurethane. The pad 51 is formed substantially in a cylindrical configuration with a bottom surface defining a horizontal contact surface to contact the wafer W. The pad 51 is formed; for example, with dimensions of about 5 mm height and about 20 mm outer diameter. The average micropore size defined in the sponge is about 110 $\mu$m. Due to the fact that the smaller is the average pore size the more effective is the sponge to remove dust, a preferred pore size is less than 80 $\mu$m. Nylon or mohair can be used as a raw material of pad 51.

While the shaft 43 may ascend and descend in the vertical direction as shown by the arrow B and the arm 45 is caused to pivot by rotation of the shaft 43 as shown by the arrow C, the pad 51 is caused to rotate in the direction of arrow D by rotation of the rotary driving shaft 49. That is, the pad mechanism 41 has a washing device which is provided at its tip end and which may rotate around its own axis.

In the meantime, reference numeral 53 represents a cup-shaped pad containing section in which pad 51 may be contained and may be cleaned when the pad mechanism 41 is inactive, and reference numeral 55 represents a nozzle for supplying a washing liquid to the surface of the semiconductor wafer W.

Figure 10:
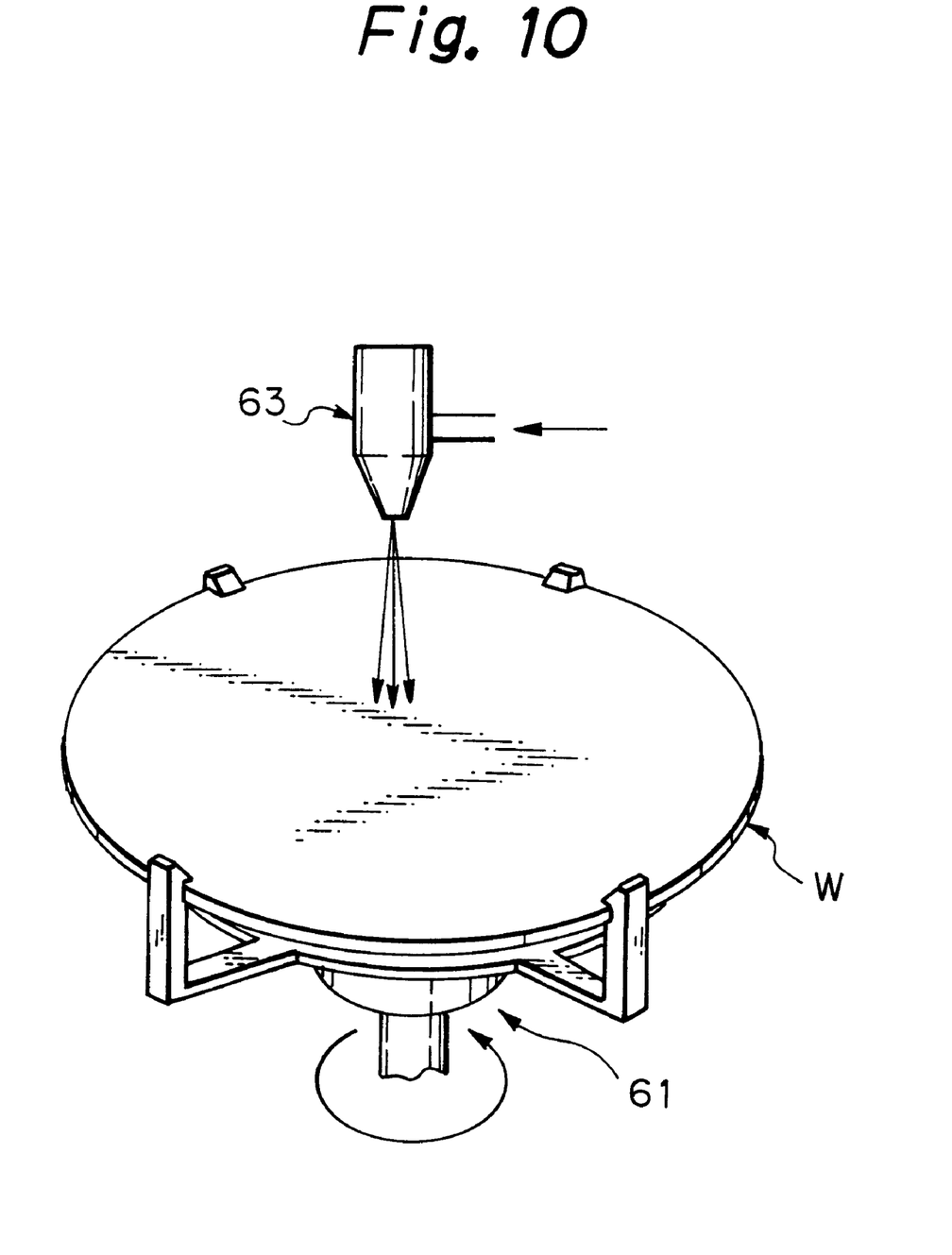
FIG. 10 is a perspective view illustrating essential parts of a spin dryer with a drying capability.

FIG. 10 is a view illustrating essential parts of the spin drier with a washing capability. As shown in FIG. 10, the spin drier 60 with a washing capability of FIG. 1 comprises a rotary chuck mechanism (rotary-driving member) 61 and a liquid injection-washing nozzle 63. The nozzle 63 is attached to the tip end of the arm which is similar to an arm 45 shown in FIG. 4, and through which a washing liquid may injected to the wafer surface while travelling over the wafer surface in the same manner as the arm 45.

Because the rotary chuck mechanism 61 is of the same construction as above-described regarding the rotary chuck mechanism 31 shown is FIG. 4, its detailed description will be omitted.

The liquid injection-washing nozzle 63 is constructed either such that it may inject a washing liquid (ultra-pure water) which has been subjected to supersonic-vibration energy, or it may inject a washing liquid (ultra-pure water) which provides cavitation, or it may inject a high-pressure washing liquid (ultra-pure water), or alternatively it may employ one or more of the above-described arrangements in combination.

Figures 7, 8:
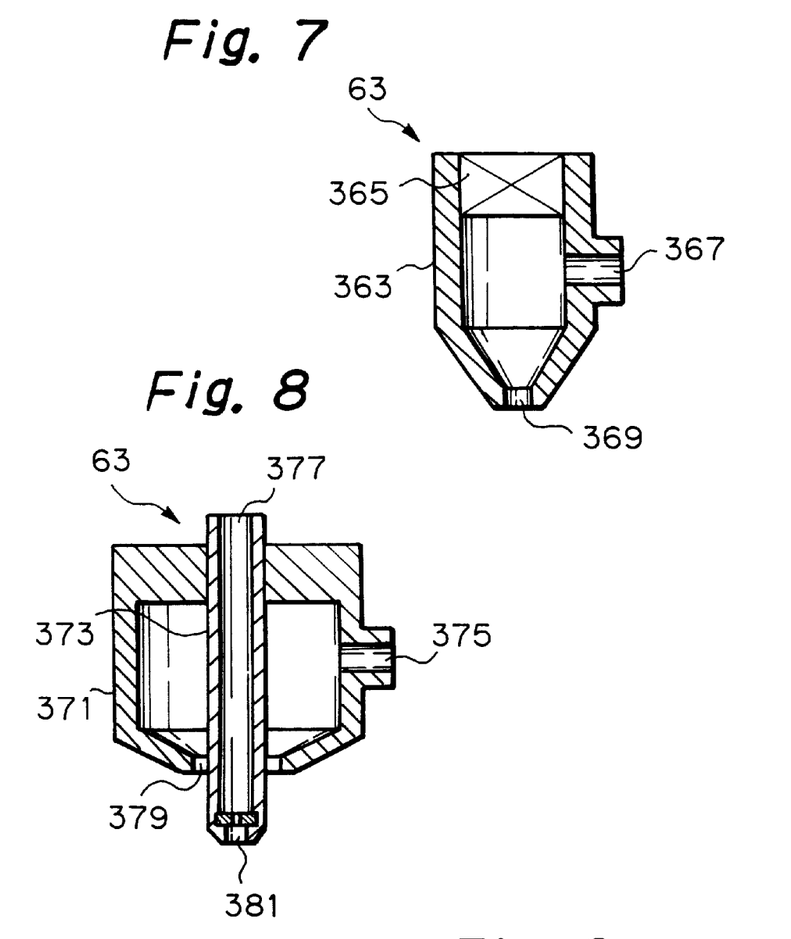
FIG. 7 is a schematic cross-section illustrating the construction of a liquid injection washing nozzle.
FIG. 8 is a schematic cross-section illustrating the construction of a liquid injection nozzle.
Figure 9:
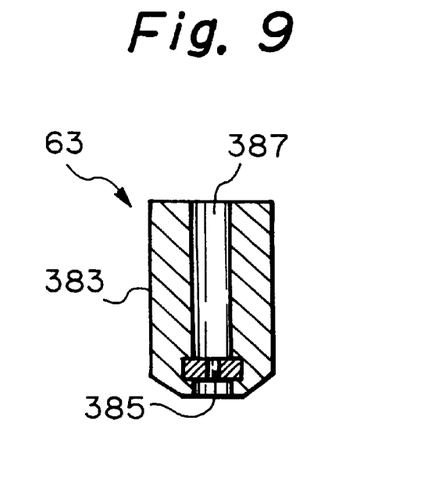
FIG. 9 is a schematic cross-section illustrating the construction of a liquid injection nozzle.

FIG. 7–FIG. 9 are schematic cross-sectional views illustrating the construction of washing nozzles 63 for injecting various washing liquids.

The washing liquid-injection washing nozzle 63 shown in FIG. 7 is to be used in a supersonic washing operation, and includes a supersonic vibrator 365 which is contained in nozzle body 363 and may impose a vibration of about 500 KHz to 1.5 MHz to the washing liquid. The nozzle 63 is adapted to inject ultra-pure water to which supersonic energy has been imposed from injection port 369 onto the upper surface of the semiconductor wafer W, by allowing washing liquid such as high-pressure ultra-pure water to be supplied through water pour port 367 while the supersonic vibrator 365 is excited.

The liquid injection-washing nozzle 63, shown in FIG. 8 is to be used in a cavitation-washing operation, and includes a high-pressure nozzle 373 contained in a low pressure nozzle 371. By supplying a high-pressure ultra-pure water, at 30–150 kg/ $CM^2$, through a pour port 377 in the high pressure nozzle 373, simultaneously with the supply of low pressure ultra-pure water, at about 1–2 kg/ $CM^2$, through a pour port 375 of the low pressure nozzle 371, cavitation occurs at the interfacial surface of two streams including a high-speed injection stream which is injected from the injection port 381 and passing through a low speed injection stream which is injected from the injection port 379. By arranging the nozzle 63 at a level where cavitation breaks away adjacent to the semiconductor wafer W, dust may be provided with cavitation-breaking energy, thereby allowing the dust to be separated from the semiconductor wafer W.

The liquid injection washing nozzle 63 shown in FIG. 9 is to be used in a high-speed jet washing operation, and includes a reduced diameter injection port 385 defined in the interior of a nozzle body 383. By supplying a high-pressure ultra-pure water, at about 30–150 kg/cm$^2$, through pour port 387, the liquid is injected in a high-speed stream through injection port 385, and is injected upon the upper surface of the semiconductor wafer W.

The entire polishing device operates as follows. As shown in FIG. 1 and FIG. 2, a cassette 165 in which unpolished semiconductors W are contained is first set in position as shown. Handle 257 of transfer robot 153 pulls the semiconductor wafers W one by one out of the cassette 165, and delivers them to work inverter device 163 so that the semiconductor W may be turned over. The semiconductor wafer W is delivered from the device 163 to the handle 255 of the transfer robot 151, and then is transferred to work delivery device 143 in the polishing section 130.

The semiconductor wafer W on the work delivery device 143 is retained in position on a lower surface of the top ring 135 of the polishing unit 137 which pivots in the direction of arrow P, and is moved to the turntable 133 where the wafer W may be polished by means of rotary polishing surface 134 which rotates. At this moment, a polishing liquid is supplied to the polishing surface 134 through a supply line (not shown).

The semiconductor W which has been polished is returned to the work delivery device 143, and handed over to the work inverting device 161 by handle 256 of the transfer robot 151. After the wafer W is turned over while being rinsed with a rinse solution, the wafer is then transferred to the primary washer 10 by handle 256.

In the primary washer 10, as shown is FIG. 3, the semiconductor wafer W which has been polished and which has accumulated a great deal of dust thereon is retained in position by urging its outer periphery into the inner circumferential grooves 12a in the tops 12. While rotating the tops 12 to turn the semiconductor wafer W, simultaneously the two cylindrical roll washing members 13 and 15 are brought into abutment with upper and lower surfaces of the semiconductor wafer W, and then a washing liquid is dispensed through the washing liquid supply nozzle 19.

In this manner, a great deal of dust which has been accumulated on upper and lower surfaces of the semiconductor wafer W is caused to flow away with the washing liquid.

The apparatus shown in FIG. 3 does not have a chuck claw 33 to rotate about a shaft 35 as does the rotary chuck mechanism 31 shown in FIG. 4. As above-described, the roll members 13 and 15 can oppose against each other from one end to an opposite end of the semiconductor wafer W, and the roll members 13 and 15 have a greater contact area with the semiconductor wafer W. Thus, it is made possible to remove dust efficiently from the semiconductor wafer W which has been polished by the polishing device and upon which a great deal of slurry and dust have accumulated. Because the roll members 13 and 15 are used while they are rotating around their own axes, their entire outer surfaces can be used for washing, resulting in an extended operational life.

Referring back to FIG. 1 and FIG. 2, the semiconductor wafer W which has been completely washed is then transferred from the primary washer 10 to the secondary washer 31 by handle 255.

In the secondary washer 30, the outer peripheral edge of the semiconductor wafer W is grasped by chuck 33, and the entire chuck mechanism 31 is caused to rotate at a high-speed, and thereby allowing the semiconductor wafer W to rotate at a predetermined speed of 500–1500 rpm, as shown in FIG. 4. The wafer rotary mechanism in FIG. 3 has a reduced speed, since the speed at which the semiconductor wafer rotates is determined by a peripheral speed of the tops 12, and slipping which occurs between the outer circumference of the semiconductor wafer W and the tops 12. However, the rotary chuck mechanism 31 in FIG. 4 is rotated merely by rotating the rotary chuck mechanism 31 with the same diameter as that of the wafer, without displacing the wafer from the chuck claw during rotation, and thus the semiconductor wafer can be spun at a high-speed. The rotary speed of the semiconductor wafer rotated by the rotary chuck mechanism in FIG. 4 can be selected from an allowable rpm range of several thousands rpm of the driving motor which is not shown and may be connected with the rotary shaft 35.

The upper surface of the semiconductor, wafer W can be washed by causing the pad 51 which is in rotating condition to abut with the upper surface of the semiconductor wafer W, and by feeding a washing liquid from washing liquid dispensing nozzle 55, with the simultaneous pivotal movement of the arm 45.

Because the pad 51 has a small contact area with the semiconductor wafer W, in contrast to the roll member 13 or 15 as shown in FIG. 3, roll members 13 or 15 may be more suitable for applications in washing a semiconductor wafer W upon which a great deal of dust particles have accumulated. However, if the roll member is used merely in place of pad 51, the roll member may abut with the chuck claw 33 and may be broken thus producing additional debris and dust. Moreover, as above-described, there is a possibility that dust may remain at the central portion of the wafer when the roll member is used. On the other hand, the pad 51 may be pivoted in a manner such that it will not abut with the chuck claws 33, and dust which may remain at the central portion of the wafer can be removed.

In the case of a semiconductor wafer W upon which a substantial amount of dust has not accumulated, the washer in FIG. 4 may wash the surface of such semiconductor wafer W while the wafer W is rotating at a high-speed. Thus, washing efficiency is improved.

By using a roll type washer as a primary washer 10 and a pad type washer as a secondary washer 30, the secondary washer may easily remove dust which is difficult for the primary washer 10 to remove, due to the completely different manners in which the two washers contact the surface of the semiconductor wafer W. This allows the two washers together to remove the dust easily and contributing to the efficient and reliable removal of dust.

Referring back to FIG. 1 and FIG. 2, the semiconductor wafer W which has been washed by the secondary washer 30 is transferred to the spin dryer 60 with a washing capability by handle 258.

In the spin dryer 60 with a cleaning capability, the semiconductor wafer W is grasped by the rotary chuck mechanism 61 and is caused to rotate at a predetermined speed of 500–1500 rpm. Simultaneously with this rotation, a liquid to which a supersonic vibration energy has been imposed is injected through the liquid injection washing nozzle 63, or a washing liquid having cavitation is injected, or alternatively a high-pressure washing liquid is injected. Thus, dust may be removed from the wafer W surface in a more reliable manner. Supply of washing liquid from the washing liquid injection washing nozzle 63 then is stopped, to be followed by spinning the wafer at a speed over 2000 rpm by rotary chuck mechanism 61, thereby achieving a spin drying effect.

The semiconductor wafer W which has been spin dried is returned back to cassette 165 by handle 257.

As above-described, in the present invention, the roll type washer which is preferred for application in washing heavily fouled work pieces is selected as the primary washer 10, and the pad type washer which is preferred for application in removing dust which is difficult for the roll type washer to remove is selected as the secondary washer 30. The total washing effect can be improved in comparison with an arrangement in which two roll type washers are used. Because the secondary washer 30 and the spin dryer 60 with the washing capability do not use the tops 12 which are used in the primary washer 10, there thus arises an advantageous merit that additional dust will not be created during rotation of semiconductor wafers, in comparison with the rotary mechanism in which the semiconductor wafer W is caused to rotate by bringing the tops 12 into contact with the semiconductor wafer W.

In the present invention, the secondary washer 30 itself can be used as a spin dryer with washing capability, thereby eliminating the need for the above-described third spin dryer with washing capability. That is, since the pad type washer is used as the secondary washer 30 in the present invention, the rotary chuck mechanism (see FIG. 4) can be used, and thus the semiconductor wafer W can be spun at a high-speed, thereby allowing this secondary washer 30 itself to spin dry the semiconductor wafer W.

Figure 11:
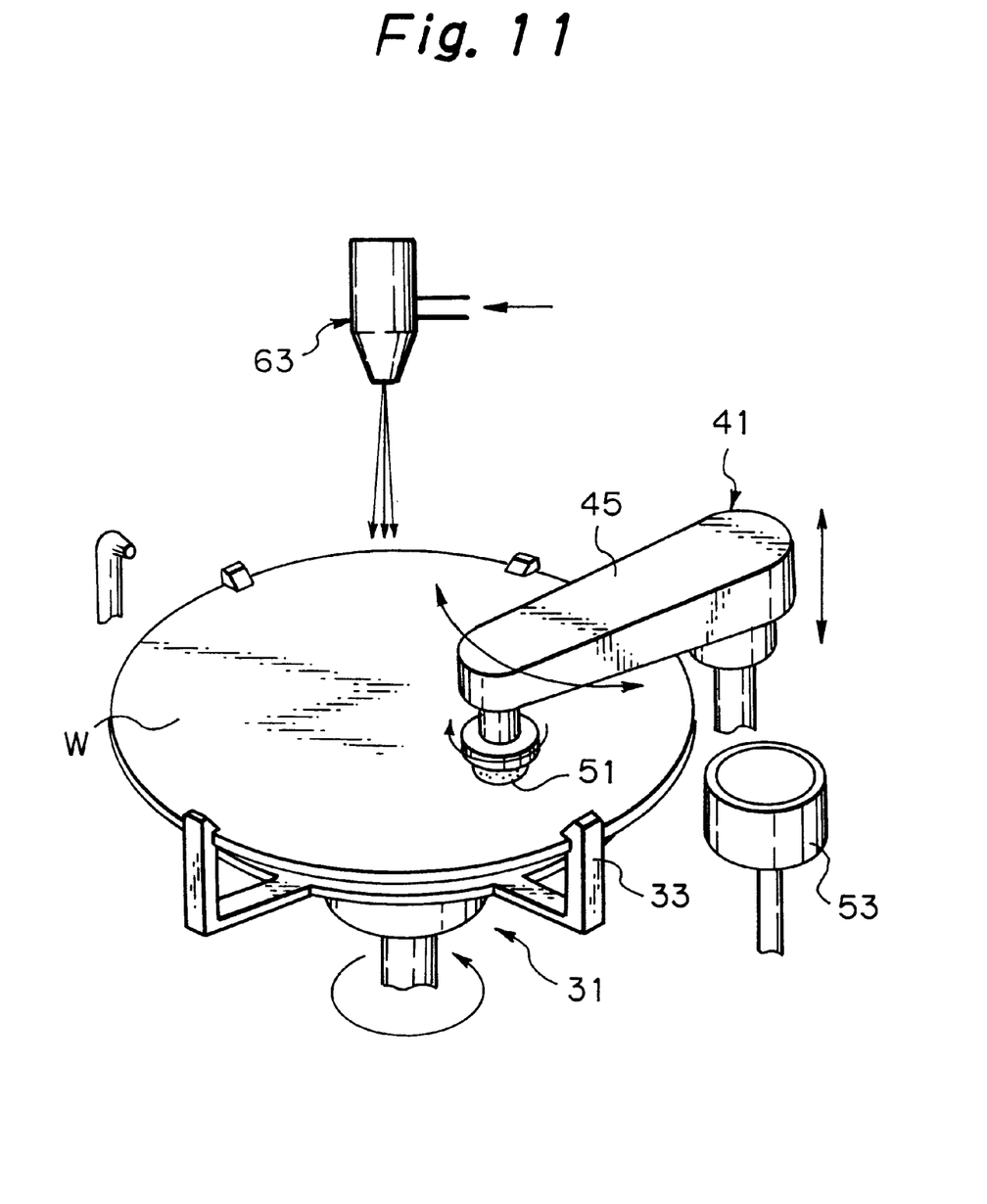
FIG. 11 is a perspective view illustrating essential parts of an alternative pad type washer to be used in a secondary washer.

Such arrangement is shown in FIG., wherein the liquid-injection washing nozzle 63 as shown in FIG. 10 is employed with the rotary chuck mechanism (rotary member) 31 and the pad mechanism 41 which are shown in FIG. 4. The secondary washer 30 thus may provide washing in combination with spin drying, enabling thereby dimensions of the washing equipment to be small.

One example of washing the semiconductor wafer has been illustrated in the above-described embodiment. However, the scope of the present invention is not limited to this embodiment, and the present invention may be applied to operations for washing works other than LCD and the like. The number of washers to be employed is not limited to that as above-described, and other washers may be used in any combination, as long as the roll type washer is used as an early stage washer, and the pad type washer is used as a subsequent stage washer.

Although in the case of the roll type washer which is used in the above-described embodiment as shown in FIG. 3 the wafer W is caused to rotate, the semiconductor wafer W alternatively may be stationary, with the roll members 13 and 15 made to swing over the semiconductor wafer W. The cylindrical type washer can be constructed such that the semiconductor wafer and roll members 13 and 15 can be relatively rotated.

Although the roll members 13 and 15 which form the roll type washer are arranged to lie on upper and lower surfaces of the semiconductor wafer W in the embodiment as shown in FIG. 3, both members 13 and 15 may be on either the upper surface or the lower surface of the semiconductor wafer W. It is also possible to arrange that the wafer be returned to the inverter device 161 or 163 for turning it over. Then the secondary washer is used to wash one surface of the wafer, to be followed by returning the wafer to the inverter device 161 or 163 for turning it over, after the wafer surfaces have been washed by the primary washer. Another surface of the wafer is washed thereafter by means of the secondary washer. In this manner, both front and reverse surfaces of the wafer can be made clean. While the wafer surface (upper surface) is being washed by means of secondary and third washers, a washing liquid can be supplied to the reverse surface of the wafer so as to prevent dust from flowing from the wafer upper surface to the wafer reverse surface. An inert gas such as N2 and the like may be supplied to the reverse surface of the wafer while the wafer is being spin dried.

Although the pad mechanism 41 which constitutes the pad type washer is arranged to lie only over the upper surface of the semiconductor wafer W in the embodiment shown in FIG. 4, mechanisms 41 alternatively may be arranged at both front and reverse surfaces of the semiconductor wafer W.

While the pad 51 is driven to rotate in the above-described embodiment, such pad may be made to be non-rotatable, and the upper surface of the semiconductor wafer W may be washed merely through the pivotal movement of the arm 45.

Alternatively, after the polishing operation is completed, the wafer may be caused to advance directly to the primary washer without use of the inverter device 161, and opposite surfaces of the wafer may be washed with the surface to be polished (secondary surface) faced downwardly, and then its reverse surface is washed by the secondary washer. Then, the wafer is returned to the inverter device 161 or 163 for turning it over, and the wafer surface is washed by the secondary washer.

In the above embodiments, pure water is used as a washing liquid, that the cleanness of the wafer can be further improved by using a chemical solution such as acid, alkaline, surfactant and the like.

As described above in detail, the present invention can provide remarkably advantageous merits which will be described hereinbelow.

The roll type washer which is optimally suited for use in washing heavily fouled works to be washed is selected as the primary washer which can wash the entire surface of the work to be washed, whereas the pad type washer which is optimum for removing dust which is difficult for the roll type washer to remove is selected as the secondary washer, to cause the work to be spun at a high-speed and to be washed. Efficient washing thus is achieved, while the roll type washing member can be maintained for a long service life in the primary washer.

Because the pad type washer is used as the secondary washer, the rotary chuck mechanism can be used in such secondary washer, thereby allowing the secondary washer to be used without modification as the spin dryer.

Because the rotary chuck mechanism can be used in the secondary washer, there is less opportunity that dust may be created during rotation of the work to be wa8hed. This is of vital importance, since the later the washing stage, the higher the level of cleanliness required.

What is claimed is:

1. A washing installation for cleaning a plate-shaped workpiece and including plural washers for performing respective successive washing operations of the workpiece, said installation further comprising:
    an early stage washer of said plural washers comprising a roll type washer including:
        a retaining member to retain and rotate the workpiece; and
        a roll member rotatable about an axis thereof and to be brought into contact with a surface of the workpiece; and
    a later stage washer of said plural washers comprising a pad type washer including:
        a rotary driving member for rotating the workpiece; and
        a pad member to move over the surface of the workpiece.

2. An installation as claimed in claim 1, wherein said roll type washer further includes means for supplying a washing liquid to the surface of the workpiece.

3. An installation as claimed in claim 1, wherein said retaining member comprises a driving mechanism for rotating the workpiece.

4. An installation as claimed in claim 1, wherein a portion of said roll member to contact the workpiece is formed of sponge material.

5. An installation as claimed in claim 1, wherein said roll member has on an outer cylindrical surface thereof a plurality of projections.

6. An installation as claimed in claim 1, wherein said pad member is rotatable about an axis that extends in a direction to be substantially perpendicular to the surface of the workpiece.

7. An installation as claimed in claim 1, wherein said pad type washer further includes means for supplying a washing liquid to the surface of the workpiece.

8. An installation as claimed in claim 1, wherein a portion of said pad member to contact the workpiece is formed of sponge material.

9. An installation as claimed in claim 1, further comprising at least one inverter device for turning over the workpiece.

10. An installation as claimed in claim 9, wherein said at least one inverter device is operable to turn over the workpiece after cleaning of the surface thereof by said roll type washer, after which said roll type washer is operable to clean an opposite surface of the workpiece.

11. An installation as claimed in claim 9, wherein said at least one inverter device is operable to turn over the workpiece after cleaning of the surface thereof by said pad type washer, after which said pad type washer is operable to clean an opposite surface of the workpiece.

* * * * *